United States Patent [19]

Rokurota

[11] Patent Number: 4,747,192

[45] Date of Patent: May 31, 1988

[54] METHOD OF MANUFACTURING AN ULTRASONIC TRANSDUCER

[75] Inventor: Haruyasu Rokurota, Ootawara, Japan

[73] Assignee: Kabushiki Kaisha Toshiba, Kawasaki, Japan

[21] Appl. No.: 896,346

[22] Filed: Aug. 14, 1986

Related U.S. Application Data

[63] Continuation of Ser. No. 686,911, Dec. 27, 1984, abandoned.

[30] Foreign Application Priority Data

Dec. 28, 1983 [JP] Japan ............................... 58-245166

[51] Int. Cl.$^4$ ............................................ H01L 41/22

[52] U.S. Cl. ..................................... 29/25.35; 29/840; 310/327; 310/334; 310/366

[58] Field of Search ............... 29/25.35, 840; 310/326, 310/327, 334–337, 800, 366

[56] References Cited

U.S. PATENT DOCUMENTS

| | | | |
|---|---|---|---|
| 3,587,561 | 6/1971 | Ziedonis | 310/335 |
| 3,952,387 | 4/1976 | Iinuma et al. | 29/25.35 |
| 4,217,684 | 8/1980 | Brisken et al. | 310/334 X |
| 4,385,255 | 5/1983 | Yamaguchi et al. | 310/335 |
| 4,404,489 | 9/1983 | Larson | 310/334 |
| 4,409,510 | 10/1983 | Assenza et al. | 310/334 |
| 4,414,482 | 11/1983 | Lewis et al. | 310/334 |
| 4,424,465 | 1/1984 | Ohigashi et al. | 310/335 |
| 4,459,850 | 7/1984 | Hyanova et al. | 310/334 X |
| 4,467,237 | 8/1984 | Piaget et al. | 310/334 |
| 4,473,769 | 9/1984 | Nguyen | 310/334 |
| 4,479,069 | 10/1984 | Miller | 310/334 |

FOREIGN PATENT DOCUMENTS 1530783 11/1978 United Kingdom ................ 310/334

OTHER PUBLICATIONS

Real-Time Imaging of Internal Body Structures; *Ultrasonics*, Nov. 1974, p. 235.

Pappalardo, "Hybrid Linear and Matrix Acoustic Arrays," Ultrasonics, pp. 81-86, Mar. 1981.

*Primary Examiner*—Carl E. Hall

*Attorney, Agent, or Firm*—Finnegan, Henderson, Farabow, Garrett and Dunner

[57] ABSTRACT

Electrode layers are formed on planes of a plate-shaped piezoelectric element to provide an ultrasonic transducer material. The ultrasonic transducer material is bonded to an electrically insulating substrate by electrically conductive adhesive. A plurality of conductors is provided on the substrate in the array direction and a direction perpendicular to the array direction. A printed circuit is formed on the backside of the substrate to connect the conductors. Notches are cut out in the ultrasonic transducer material to divide it into a plurality of transducer elements arranged in the array direction and a direction perpendicular to the array direction. A ground electrode connects the second electrodes of the ultrasonic transducer elements. The transducer elements are impressed with voltage through the printed circuit and ground electrode to issue ultrasonic waves.

4 Claims, 5 Drawing Sheets

METHOD OF MANUFACTURING AN ULTRASONIC TRANSDUCER

This application is a continuation of application Ser. No. 686,911, filed Dec. 27, 1984, now abandoned.

BACKGROUND OF THE INVENTION

This invention relates to an ultrasonic transducer which radiates ultrasonic waves into the body of a patient and detects echoes reflected from, for example, the internal organs of the patient, and a method of manufacturing the same.

FIGS. 1 and 2 show the conventional ultrasonic transducers. The transducers are constructed by arranging a plurality of ultrasonic transducer elements on an ultrasonic wave absorber 12 in first and second directions. The probe 10 of FIG. 1 comprises a plurality of transducer elements which are set side by side in the array direction 2 and extend in a direction 4 perpendicular to the array direction 2. The transducer element 14 comprises a piezoelectric element and electrodes 16, 18 respectively baked to the upper and lower planes of said piezoelectric element, said lower plane facing the ultrasonic wave absorber. A ground electrode 20 is, for example, soldered to all the electrodes 16 to render them conductive. Lead lines 22 are, for example, soldered to the electrodes 18.

In the conventional ultrasonic transducer 24 of FIG. 2, the transducer element 14 is divided into three parts (transducer element groups **14*a*, 14*b*, 14*c*) which are arranged in the indicated direction 4. Ground electrodes 20*a*, 20*b*, 20*c* respectively connect the transducer element groups 14*a*, 14*b*, 14*c* which are set side by side in the array direction 2**.

The conventional ultrasonic transducer 10 of FIG. 1 is characterized in that signals sent forth from the transducer elements 14 are controlled to have their phases changed for each transducer element, thereby elevating the directionality with respect to the array direction 2. With the probe 10, however, the direction of the signals can be controlled only with respect to said array direction 2. Conversely, with the conventional ultrasonic transducer 24 of FIG. 2, the phases of the signals set forth from the transducer elements 14 can have their phases controlled with respect to both directions 2 and 4, thereby enabling ultrasonic waves issued from the transducer to be converged in the form of a round conical shape.

The conventional ultrasonic transducer 24 of FIG. 2 whose transducers are arrayed in two directions, namely, in the lattice form, is manufactured in the following manner. The first manufacturing method comprises the following steps. A lead line 22 is welded to the underside of each of the transducer element groups **14*a*, 14*b*, 14*c*. These transducer elements are equidistantly fixed to the surface of the ultrasonic wave absorber 12 so as to be arranged in the array direction 2. Ground electrodes 20*a*, 20*b*, 20*c* each formed of a thin metal sheet are, for example, soldered to the corresponding groups 14*a*, 14*b*, 14*c* of the transducers. The second manufacturing method comprises the following steps. A plate transducer material having substantially the same size as the plane of the ultrasonic wave absorber 12 is provided. Lead lines 22 are welded to those portions of the underside of said plate transducer material which correspond to the set positions of the transducer elements belonging to the groups 14*a*, 14*b*, 14*c***.

After the plate transducer material now provided with lead lines 22 is adhered to the ultrasonic wave absorber 12, notches extending in the directions 2 and 4 are equidistantly cut out in the surface of said plate transducer material (sgl) to provide three groups of transducer elements **14*a*, 14*b*, 14*c*. Thereafter, ground electrodes 20*a*, 20*b*, 20*c* are welded to the corresponding groups 14*a*, 14*b*, 14*c*** of transducer elements.

The above-mentioned, first manufacturing method is accompanied with the drawback that difficulties are presented in arranging numerous transducer elements in the array directions 2 and 4 at an accurate equal distance. The second manufacturing method is also unsatisfactory in that it is difficult to solder numerous lead lines to the plate transducer material at a prescribed distance, and further, the lead lines are likely to be broken when said plate transducer material is notched. In both first and second manufacturing methods, it is necessary to draw out the numerous lead lines welded to the underside of said plate transducer material by letting them penetrate the holes formed through the ultrasonic wave absorber 12 or by letting said lead lines extend through grooves cut out in the welded plane of said ultrasonic wave absorber 12. Such a step unavoidably gives rise to structural complexities. This drawback becomes more noticeable, as the transducer element is further miniaturized and a larger number of lead lines are applied. As a result, difficulties are present in the treatment of the terminals of the groups of lead lines and their proper arrangement, thereby hindering the manufacture of an ultrasonic transducer in the miniaturized form. The above-mentioned circumstances hinder the dissemination of the technology of manufacturing an ultrasonic transducer whose transducers are arranged in two array directions and which offer various advantages in ultrasonic diagnosis.

SUMMARY OF THE INVENTION

This invention is intended to provide an ultrasonic transducer which allows for the use of numerous transducer elements and can be easily manufactured in the miniaturized form. Another object of the invention is to provide a method of easily manufacturing a midget ultrasonic probe provided with numerous transducer elements.

To attain the above-mentioned object, this invention provides an ultrasonic transducer which comprises:

an insulation member which has first and second planes, the insulation member including a plurality of conductors effecting conduction between the first and second planes, and a printed circuit formed on the second plane to connect the conductors;

a plurality of ultrasonic transducer elements each of which includes a piezoelectric element having an ultrasonic wave transmission-reception plane, a first electrode formed on the ultrasonic wave transmission-reception plane and a second electrode sandwiching the piezoelectric element with the first electrode and mounted on the first plane of the insulation member in contact with the conductor, the ultrasonic transducer elements being formed from an ultrasonic transducer material by cutting out notches between the ultrasonic transducer elements for their separation; and a ground electrode for effecting connection between a plurality of first electrodes, and wherein voltage is impressed on the transducer elements through the printed circuit and ground electrodes, thereby causing ultrasonic waves to be sent forth from the transducer elements.

The method of manufacturing the ultrasonic probe embodying this invention comprises the steps of:

forming conductors on an insulation member having first and second planes to effect conduction between said first and second planes;

forming a printed circuit on the second plane of the insulation member to connect said conductors;

forming first and second electrodes on planes of a plate piezoelectric element, respectively, to provide an ultrasonic transducer material;

fixing the ultrasonic transducer material to the first plane of the insulation member so as to effect connection between the second electrode and conductors;

cutting out notches in the ultrasonic transducer material to separate a plurality of ultrasonic transducer elements provided for the respective conductors; and providing a ground electrode connected to the first electrode.

The ultrasonic probe embodying this invention offers the advantages that the second electrodes of the transducer elements are drawn out through the conductors and printed circuit, thereby eliminating the difficulty of drawing out lead lines which was experienced in the conventional ultrasonic transducer. The ultrasonic transducer can also be miniaturized and allows the use of a large number of transducer elements. Further, the method of this invention for manufacturing such an ultrasonic transducer has the merit that even when a large number of small transducer elements are used, it is unnecessary to fix the lead lines to the transducer elements and draw out the lead lines to the outside, thereby facilitating the manufacture of an ultrasonic transducer.

DETAILED DESCRIPTION OF THE PREFERRED EMBODIMENTS

Figure 1:
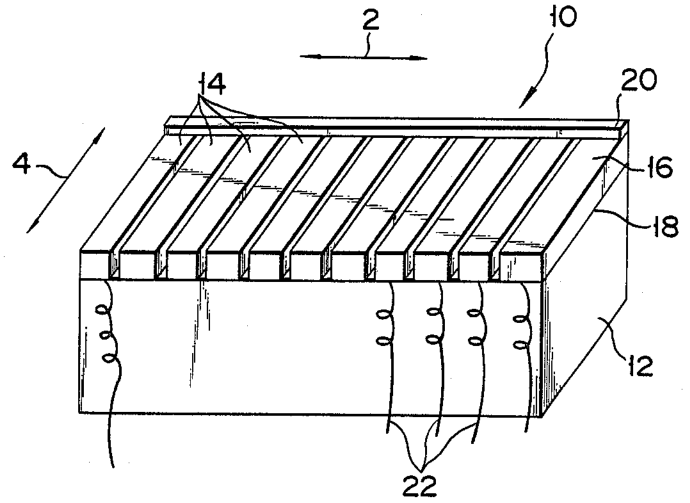
FIG. 1 (PRIOR ART)
FIG. 1 is an oblique view of the conventional one-direction type ultrasonic transducer.
Figure 2:
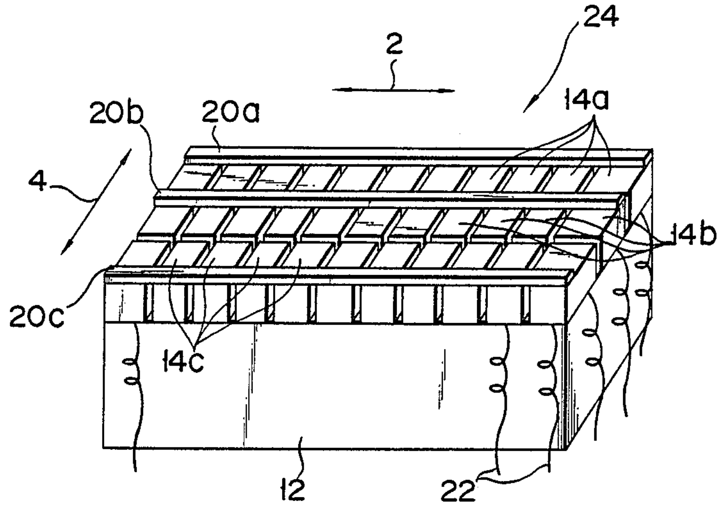
FIG. 2 (PRIOR ART)
FIG. 2 is an oblique view of the conventional two-directions type ultrasonic transducer.
Figure 3:
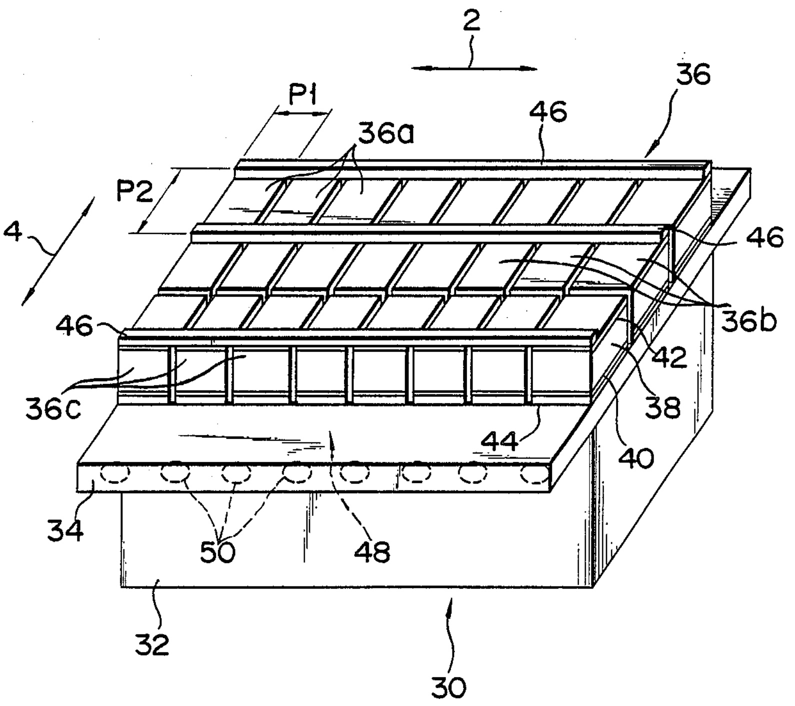
FIG. 3 is an oblique view of an ultrasonic transducer according to a first embodiment of this invention.
Figure 4A:
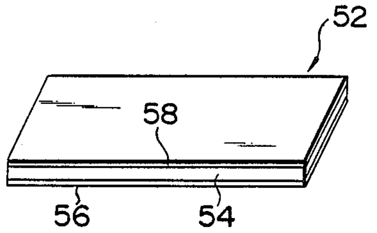
FIGS. 4A to 4F are oblique views showing the sequential steps of manufacturing an ultrasonic transducer according to the first embodiment of the invention.
Figure 4E:
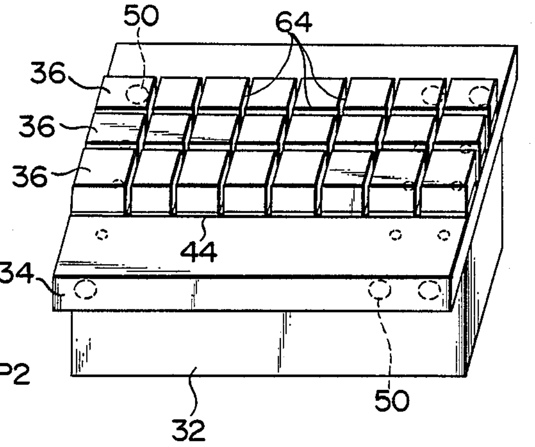

FIG. 3 illustrates an ultrasonic transducer 30 according to a first embodiment of this invention. FIGS. 4A to 4F are oblique views showing the sequential steps of manufacturing said ultrasonic transducer 30. As seen from FIG. 4E, a substrate 34 prepared from glass-epoxy resin is fixed on an ultrasonic wave absorber 32 formed of ferrite rubber. Both members have substantially the same sound impedance of about $4\times10^6$ kg/m$^2$ sec. A plurality of (3 rows$\times$8 columns as indicated) transducer elements 36 are arranged in the array direction 2 and a direction perpendicular to the array direction 2. The ultrasonic wave transmission-reception plane of the respective transducer elements 36 has an area of P1$\times$P2. Each transducer comprises a piezoelectric element 38 prepared from, for example, piezoelectric ceramic material to produce an ultrasonic wave, and an electrode layer 40 formed on that side of said piezoelectric element 38 which faces the substrate 34 and another electrode layer 42 formed on the opposite side of said piezoelectric element 38. An electrically conductive adhesive layer 44 is interposed between the transducer element 36 and substrate 34. Transducer elements 36*a*, 36*b*, 36*c* arranged in parallel in the array direction 2 are jointly connected by three perpendicularly extending rod-shaped ground electrodes 46. Printed circuits 48, shown in FIG. 4C, are formed on that side of the substrate 34 which faces the ultrasonic wave absorber 32. The terminals 50 of the printed circuits 48 are formed on those portions of the underside of the substrate 34 (facing the ultrasonic wave absorber 32) which protrude from said ultrasonic absorber 32. The terminals 50 and ground electrodes 46 are connected to a drive circuit (not shown) of the ultrasonic transducer 30. Pulse voltage is impressed on the transducer elements 36 through said terminals 50 and ground electrodes 46. A layer (not shown) for matching acoustic impedances between an acoustic transmitter, for example, water, and the transducer 30 and an acoustic lens layer (not shown) for elevating the direction control of ultrasonic waves are laminated on those sides of the transducer elements 36 which face the ground electrodes 46.

With an ultrasonic transducer 30 constructed as described above, the drive circuit impresses the pulse voltage whose phase has been controlled to a prescribed level upon the printed circuit terminals 50. When the pulse voltage is supplied to the electrodes 40, 42 of the transducer elements 36 through the printed circuit 48 and ground electrodes 46, the piezoelectric element 38 of each transducer element 36 is actuated to issue an ultrasonic wave. The ultrasonic wave absorber 32 so acts as to dampen the vibrations of the transducer element 36. The ultrasonic waves are conducted into a patient's body through the acoustic transmitter such as water. Echoes reflected from the internal organs of the patient vibrate the transducer elements 36 through the acoustic transmitter, thereby inducing voltage. This voltage is detected by a detector connected to the terminals 50, thereby distinguishing the position of that internal organ of the patient which has been diagnosed.

A description may now be made of the method of manufacturing an ultrasonic transducer 30 according to a first embodiment of this invention, which is arranged as described above. As shown in FIG. 4A, an ultrasonic transducer member 52 comprises a plate piezoelectric element 54 prepared from, for example, piezoelectric ceramic material and electrode layers 56, 58 baked to both surfaces of said plate piezoelectric element 54. When the piezoelectric element 54 has a thickness of, for example, 0.3 mm, the ultrasonic probe issues ultrasonic waves having a frequency of 5 MHz.

Figure 4B:
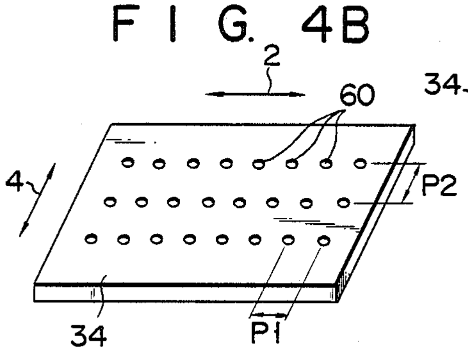
Figure 4C:
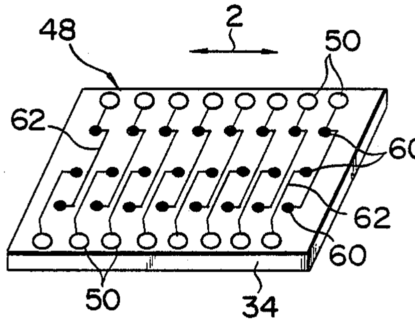
Figure 4F:
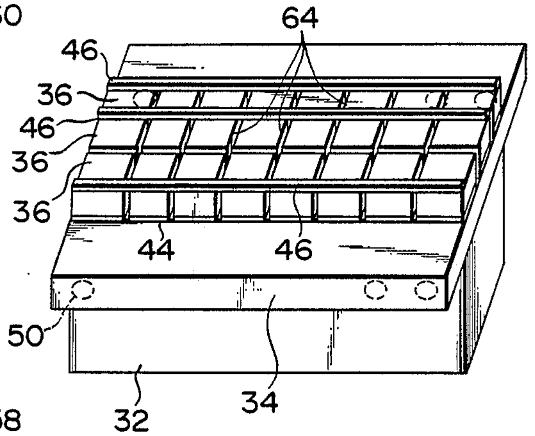

The electrically insulating substrate 34 prepared from glass-epoxy resin is made longer than the ultrasonic transducer material 52 in the direction of the arrow 4 indicated in FIG. 4B and has a thickness of, for example, 0.4 mm. Conductors 60 for effecting electric conduction between the front and back surfaces of the substrate 34 are formed in the matrix form (namely, 3 conductors arranged in the direction of the arrow 4 and 8 conductors arranged in the direction of the arrow 2). The conductors 60 are arranged in the direction of the arrow 4 at a distance of P2. These conductors 60 can be provided by the through hole technique. This through hole technique comprises the steps of drilling a through hole in the prescribed positions of the substrate 34, and plating the inner wall of the holes with, for example, copper, thereby effecting electrical conduction between the front and back surfaces of the substrate 34. When the conductors 60 are so designed as to be narrowly spaced from each other, it is possible to pour electrically conductive adhesive in the holes formed in the substrate 34, thereby providing said conductors 60. FIG. 4C shows the pattern of the back surface of the substrate 34. As seen from FIG. 4C, printed circuit 48 are formed on the back surface of the substrate 34. Eight terminals 50 are formed on both edges of the substrate 34, extending in the direction of the arrow 2. The terminals 50 arranged along one lateral edge of the substrate 34 are connected to conductors 60 formed at the center portion of the substrate 34, as viewed from the direction of the arrow 4, by the conductors 62. The terminals 50 arranged along opposite lateral edges of the substrate 34 are connected to conductors 60 formed along the lateral sides of the substrate 34, as viewed from the direction of the arrow 4, by the conductors 62. The printed circuit 48 can be formed by etching or screen printing.

Figure 4D:
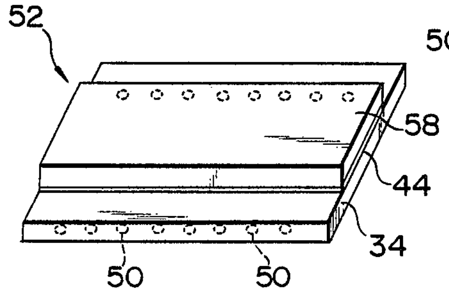

As seen from FIG. 4D, the transducer material 52 is superposed on that side of the substrate 34 on which the printed circuit 48 are not formed. Both members 52, 34 are bonded together by electrically conductive adhesive, thereby providing a layer 44 of electrically conductive adhesive between the transducer material 52 and substrate 34. As shown in FIG. 4E, notches 64 extending in the directions of the arrows 2 and 4 are cut out from the transducer material 52, thereby dividing the transducer material 52 into transducer elements 36 arranged in the matrix form (that is, 3 rows and 8 columns). The notches 64 can be provided, for example, by a diamond saw. The notches 64 are cut so deeply as to reach the layer 44 of the electrically conductive adhesive. As a result, said layer 44 of the electrically conductive adhesive is divided into the matrix form, namely, a pattern of 3 rows and 8 columns. The notches 64 are set at a pitch P1, as viewed from the direction of the arrow 2, and at a pitch P2, as viewed from the direction of the arrow 4. As a result, the transducer material 52 is so divided as to cause the conductors 60 to face the transducer elements 36. The electrodes 40 of the transducer elements 36 are connected to the conductors 60 through the layer 44 of the electrically conductive adhesive, and then to the terminals 50 of the printed circuit 48 through their conductors 62.

Thereafter, three ground electrodes 46 for collectively connecting the three groups **36*a*, 36*b*, 36*c* of transducer elements arranged in the array direction 2 are mounted on the electrodes 42 of the transducer elements 36. Said ground electrodes 46 are constructed by fixing thin metal sheets to the electrodes 42 by electrically conductive adhesive or, for example, by soldering. Otherwise, said ground electrodes 46 may be formed by applying electrically conductive adhesive to the surface of the electrodes 42 of the transducer elements 36. Since the notches 64 are formed between the transducer elements 36, it is advised to apply the electrically conductive adhesive after filling said notches 64 with electrically insulating resin, for example, epoxy resin. Thereafter, a layer for matching acoustic impedances between the acoustic transmitter and the transducer 30 and an acoustic lens for elevating the directional control of ultrasonic waves are provided. The ultrasonic transducer 30 of FIG. 3** embodying this invention is manufactured through the above-mentioned steps.

In the foregoing example, notches 64 are cut out in the transducer material 52 after the substrate 34 is adhered to the ultrasonic absorber 32. However, it is possible to adhere the transducer material 52 to the substrate 34, cut out the notches 64 in said transducer material 52, and thereafter fix the substrate 34 to the ultrasonic wave absorber 32. The printed circuit need not be formed in the shape described in the foregoing example. But the printed circuit may be formed in such a shape as to enable an independent signal to be issued to each transducer element 36.

Figure 5:
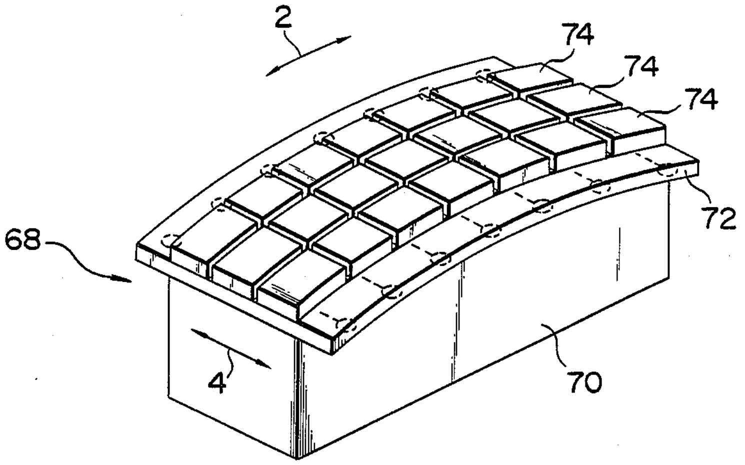
FIG. 5 is an oblique view of an ultrasonic transducer according to a second embodiment of the invention.

A description may now be made with reference to FIG. 5 of an ultrasonic transducer 68 according to a second embodiment of this invention. The ultrasonic transducer 68 according to the second embodiment is different from that of FIG. 3 in that the ultrasonic wave transmission-reception plane of said ultrasonic transducer 68 is made in the arcuate form. The upper plane of an ultrasonic wave absorber 70 is rendered convex in the array direction 2. The substrate 72 mounted on the ultrasonic wave absorber 70 is also rendered convex. An ultrasonic wave transmission-reception plane consisting of all the transducer elements 74 provided on the substrate 72 is also rendered convex.

The ultrasonic transducer 68 according to the second embodiment of this invention may be manufactured by adhering a transducer material to the surface of a substrate, outwardly warping said transducer material, adhering it to the surface of the ultrasonic absorber 70 and thereafter cutting out notches in the transducer material. However, it is possible to adhere the transducer material to the surface of the substrate, cut out notches in said transducer material, outwardly warp the substrate, and adhere said substrate to the surface of the ultrasonic wave absorber 70. The latter process allows for the easy curving of the substrate in the notched sections, offering an advantage in the manufacture of the ultrasonic transducer according to the second embodiment.

Figure 6:
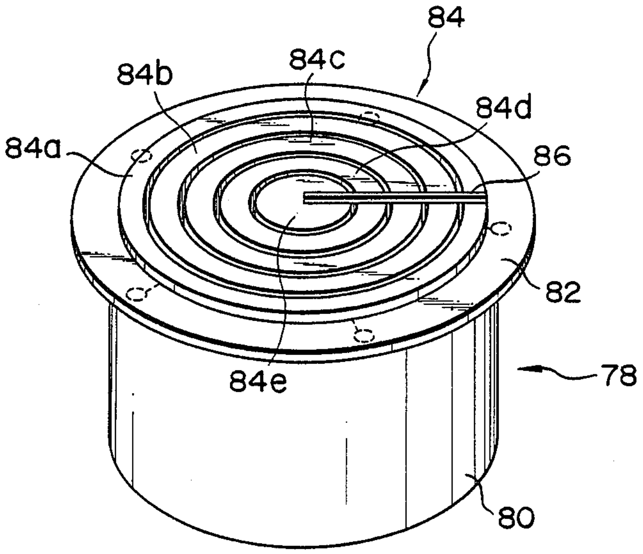
FIG. 6 is an oblique view of an ultrasonic transducer according to a third embodiment of the invention.

A description may now be made with reference to FIG. 6 of an ultrasonic probe according to a third embodiment of this invention. An ultrasonic wave absorber 80 involved in the ultrasonic transducer according to said third embodiment is made in the round columnar form. A disc substrate 82 is mounted on the surface of said ultrasonic absorber 80. A disc transducer material 84 is adhered to the surface of said disc substrate 82. This transducer material 84 is divided by notched into ring-shaped transducer elements **84*a*, 84*b*, 84*c*, 84*d*, and disc-shaped transducer 84*e*. An ground electrode 86 is provided for the joint connection of these transducer elements. Even the above-mentioned round columnar ultrasonic transducer 78** provided with a ring-shaped ultrasonic wave transmission-reception plane can issue ultrasonic waves along a horizontal plane, namely, a plane defined by two dimensions. The ring-shaped notches can be formed by laser beams.

Figure 7:
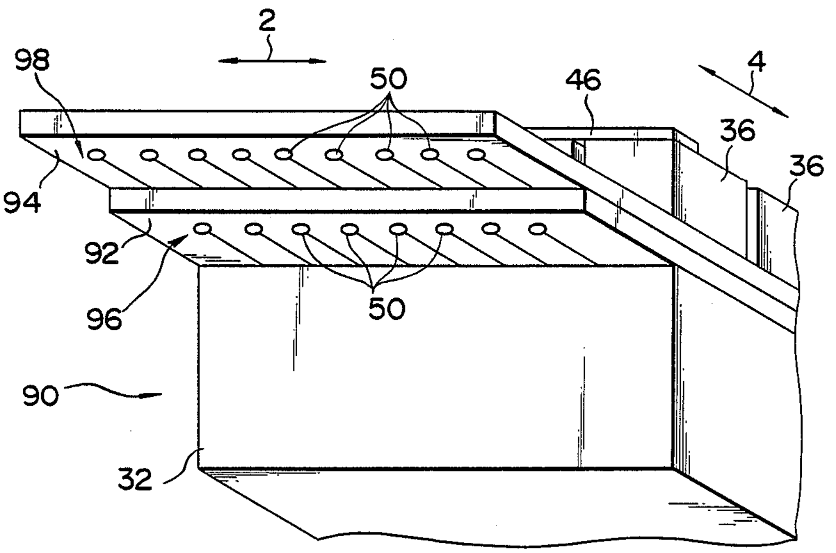
FIG. 7 is an oblique view of an ultrasonic transducer according to a fourth embodiment of the invention.

A description may now be made with reference to FIG. 7 of an ultrasonic transducer according to a fourth embodiment of this invention. FIG. 7 is an oblique view of said ultrasonic transducer 90 as taken from below. A first substrate 92 is fixed to the surface of an ultrasonic wave absorber 32 by electrically insulating adhesive. A second substrate 94 is fitted to the surface of said first substrate 92 similarly by electrically insulating adhesive. Transducer elements 36 are provided on the second substrate 94. The first substrate 92 is made longer than the ultrasonic wave absorber 32 in the direction of the arrow 4. The second substrate 94 is made longer than said first substrate 92 in the direction of the arrow 4.

Printed circuits 96 are formed on the underside of the first substrate 92. Printed circuits 98 are formed on the underside of the second substrate 94. The printed circuits 96 are connected to about half of all the transducer elements 36 by conductors for effecting electric conduction between the first and second substrates 92, 94. The printed circuit 98 are connected to the remaining transducers 36 by conductors for rendering the second substrate 94 conductive. The terminals 50 of the printed circuit 96 are formed on the projections outwardly extending from the ultrasonic wave absorber 32 set beneath the first substrate 92. The terminals 50 of the printed circuits 98 are provided on the projections outwardly extending from the first substrate 92 underlying the substrate 94.

Even when the transducer elements are miniaturized, resulting in the narrow arrangement of the conductors, the ultrasonic transducer of FIG. 7 according to the fourth embodiment of this invention which comprises two substrates 92, 94 enables the conductors to be easily drawn out. The reason is that though the application of a single substrate unavoidably narrows the printed circuit and reduces the resistance between the respective terminals, the use of two substrates prevents the printed circuit from being narrowed and allows for a certain margin in the distance between the terminals.

What is claimed is:

1. A method of manufacturing an ultrasonic transducer, which comprises the steps of:

forming an arrangement of a plurality of conductors penetrating an insulation member having first and second planes, thereby effecting electrical conduction between said first and second planes;

forming a printed circuit on the second plane of the insulation member to be connected to the conductors;

forming first and second electrodes on surfaces of a plate-shaped piezoelectric element, respectively, to provide a plate-shaped ultrasonic transducer member;

directly fixing the unltrasonic transducer member to the first plane of the insulation member with an electrically conductive adhesive, so as to effect connection between the second electrode and said conductors; then cutting out notches in the plate-shaped ultrasonic transducer member corresponding to the arrangement of the conductors to divide it into a plurality of individual ultrasonic transducer isolated elements each individual element having a respective conductor;

forming a ground electrode connected to the first electrodes adhering an ultrasonic wave absorber to the second plane of the insulation member, thereby dampening the vibrations of the transducer elements.

2. The method according to claim 1, which comprises the steps of cutting the notches extending in the array direction and a direction perpendicular to the array direction and providing a plurality of transducer elements extending in the array direction.

3. The method according to claim 1, which comprises the steps of rendering the insulation member convex with the second plane thereof on the concave side, and adhering the insulation member to the surface of the ultrasonic wave absorber, thereby causing the ultrasonic wave transmission-reception planes of all the transducer elements of the ultrasonic transducer to be rendered convex in the array direction.

4. The method according to claim 1, wherein said insulation member has a width dimension larger than that of the ultrasonic wave absorber and the printed circuit is disposed on said second plane of the insulation member so as to expose a portion of the printed circuit.

* * * * *